United States Patent
Lee

(10) Patent No.: US 6,787,426 B2
(45) Date of Patent: Sep. 7, 2004

(54) METHOD FOR FORMING WORD LINE OF SEMICONDUCTOR DEVICE

(75) Inventor: Won Chang Lee, Seoul (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 10/603,611

(22) Filed: Jun. 26, 2003

(65) Prior Publication Data

US 2004/0082155 A1 Apr. 29, 2004

(30) Foreign Application Priority Data

Jul. 18, 2002 (KR) .................................. 10-2002-42119

(51) Int. Cl.[7] .......................... H01L 21/336; H01L 21/76
(52) U.S. Cl. ...................................... 438/301; 438/445
(58) Field of Search ................................ 438/301, 618, 438/256, 257, 466, 445, 130, 595, 258

(56) References Cited

U.S. PATENT DOCUMENTS

| | | | | |
|---|---|---|---|---|
| 6,159,835 A | * | 12/2000 | Visokay et al. | 438/592 |
| 6,406,959 B2 | * | 6/2002 | Prall et al. | 438/258 |
| 6,649,453 B1 | * | 11/2003 | Chen et al. | 438/466 |
| 6,649,490 B1 | * | 11/2003 | Lee et al. | 438/445 |
| 6,649,510 B2 | * | 11/2003 | Lee | 438/618 |
| 6,696,713 B2 | * | 2/2004 | Ishibashi | 257/296 |
| 6,710,420 B2 | * | 3/2004 | Dickerson et al. | 257/506 |
| 6,716,644 B2 | * | 4/2004 | Nejad et al. | 438/257 |

* cited by examiner

Primary Examiner—John F. Niebling
Assistant Examiner—Walter L. Lindsay, Jr.
(74) Attorney, Agent, or Firm—Jacobson Holman PLLC

(57) ABSTRACT

A method for forming word line of semiconductor device wherein a lower portion of the word line on the channel region is a I-type and a upper portion of the word line is a line-type is disclosed. The method comprises (a) forming a sacrificial insulation film on a semiconductor substrate including an active region; (b) etching the sacrificial insulation film to form an I-type sacrificial insulation film pattern whereon a channel region is to be formed; (c) forming a source/drain region; (d) forming a first interlayer insulation film; (e) planarizing the first interlayer insulation film to expose the sacrificial insulation film pattern; (f) sequentially forming a insulation film and a second interlayer insulation film; (g) etching the second interlayer insulation film and insulation film using a word line mask; (h) removing the sacrificial insulation film pattern; (i) growing a gate oxide film; (j) forming a conductive layer; and (k) planarizing the conductive layer.

6 Claims, 8 Drawing Sheets

METHOD FOR FORMING WORD LINE OF SEMICONDUCTOR DEVICE

BACKGROUND OF THE INVENTION

1. Field of the Invention

The present invention generally relates to, a method for forming word line of semiconductor device, and more specifically, to a method for forming word line of semiconductor device wherein a lower portion of the word line on the channel region is a I-type and a upper portion of the word line is a line-type for improved characteristics, yield and reliability of the device.

2. Description of the Prior Art

FIG. 1 is a layout view of a conventional word line, and FIG. 2 is a cross-sectional view taken along the line I—I of FIG. 1.

Referring to FIGS. 1 and 2, gate electrodes 17 having gate oxide films 15 disposed on a p-type semiconductor substrate 11 having device isolation films 13 defining active regions 12, and source/drain regions 19 disposed on the semiconductor substrate 11 at both sides of the gate electrode 17 are illustrated.

The active regions 12 are spaced apart by a predetermined distance from one another in horizontal direction, and alternately arranged in vertical direction. Word lines which are the line-type gate electrodes 17 are spaced apart by a predetermined distance in horizontal direction, and cross the active region 12 at two points.

Since the gate electrode 17 is line-type gate electrode, the gate electrode 17 overlaps an end portion of the active region 12 shown as 'A' in FIG. 1, as well as the two point where the gate electrode 17 cross the active region 12. The overlapping generates Gate Induced Drain Leakage("GIDL") due to a voltage difference between the word line and the source/drain region, which leads to loss of charges stored in a capacitor, thereby degrading the refresh characteristics of the device.

SUMMARY OF THE INVENTION

It is an object of the present invention to provide a method for forming word line of semiconductor device wherein a lower portion of the word line on the channel region is a I-type and a upper portion of the word line is a line-type so that the overlap of the end of the active region and the word line is prevented to reduce GIDL and to improve characteristics, yield and reliability of the device.

In order to achieve the above object of the present invention, a method for forming word line of semiconductor device, comprising the steps of: (a) forming a sacrificial insulation film on a semiconductor substrate including a device isolation film defining an active region; (b) selectively etching the sacrificial insulation film to form an I-type sacrificial insulation film pattern on a predetermined region of the active region where a channel region is to be formed; (c) forming a source/drain region on the semiconductor substrate at both sides of the sacrificial insulation film pattern; (d) forming a first interlayer insulation film on the entire surface; (e) planarizing the first interlayer insulation film to expose a top surface of the sacrificial insulation film pattern; (f) sequentially forming a insulation film and a second interlayer insulation film on the entire surface; (g) etching the second interlayer insulation film and insulation film using a word line mask; (h) removing the sacrificial insulation film pattern to expose the semiconductor substrate; (i) growing a gate oxide film on the exposed portion of the semiconductor substrate; (j) forming a conductive layer on the entire surface; and (k) planarizing the conductive layer to expose the second interlayer insulation film is provided.

DETAILED DESCRIPTION OF THE PREFERRED EMBODIMENTS

The present invention will be explained in detail referring to the accompanying drawings.

FIGS. 3a through 3d are layout views illustrating a method for forming word line in accordance with one embodiment of the present invention, and FIGS. 4a through 4d are cross-sectional diagrams taken along the lines I—I and II—II of FIGS. 3a through 3d, respectively.

Figure 1:
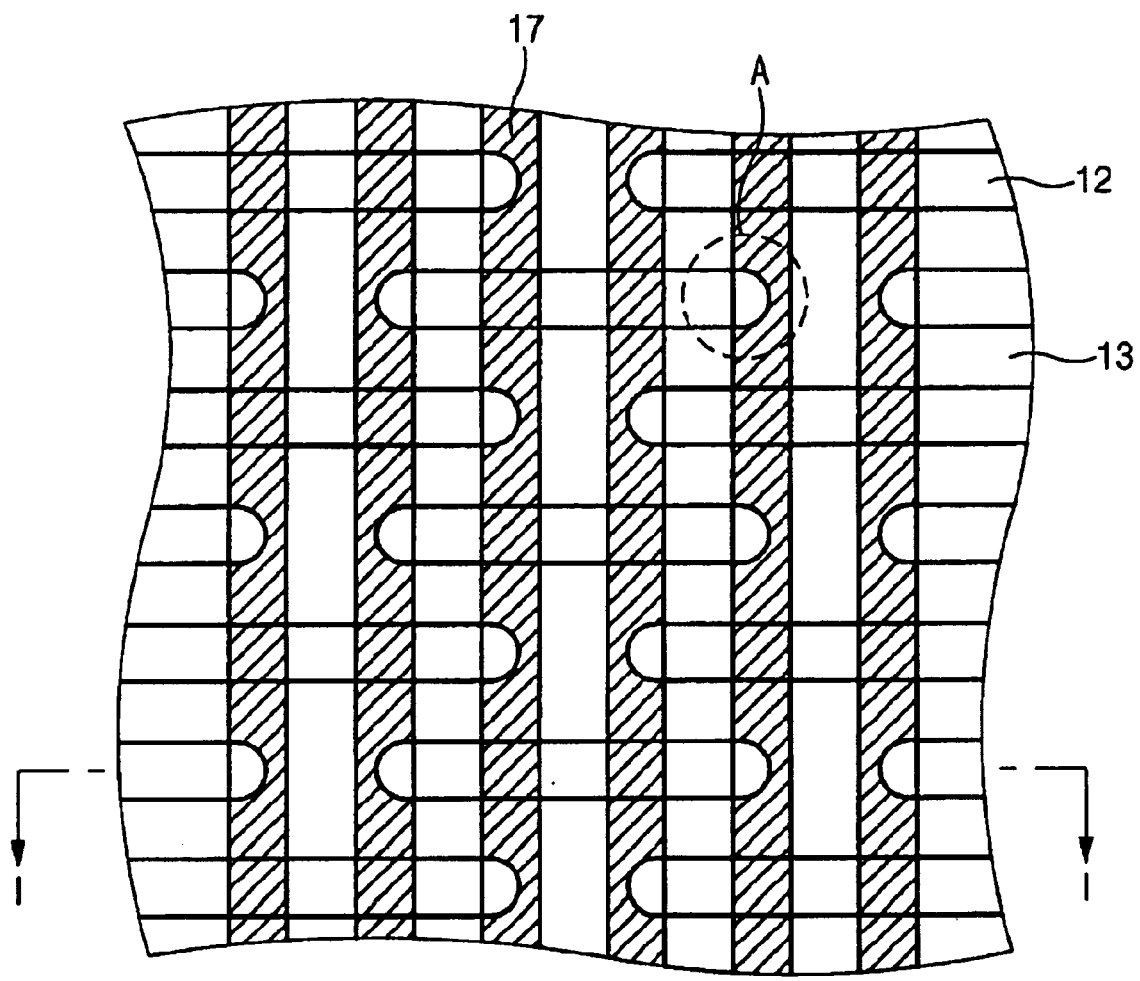
FIG. 1 is a layout view of a conventional word line.
Figure 2:
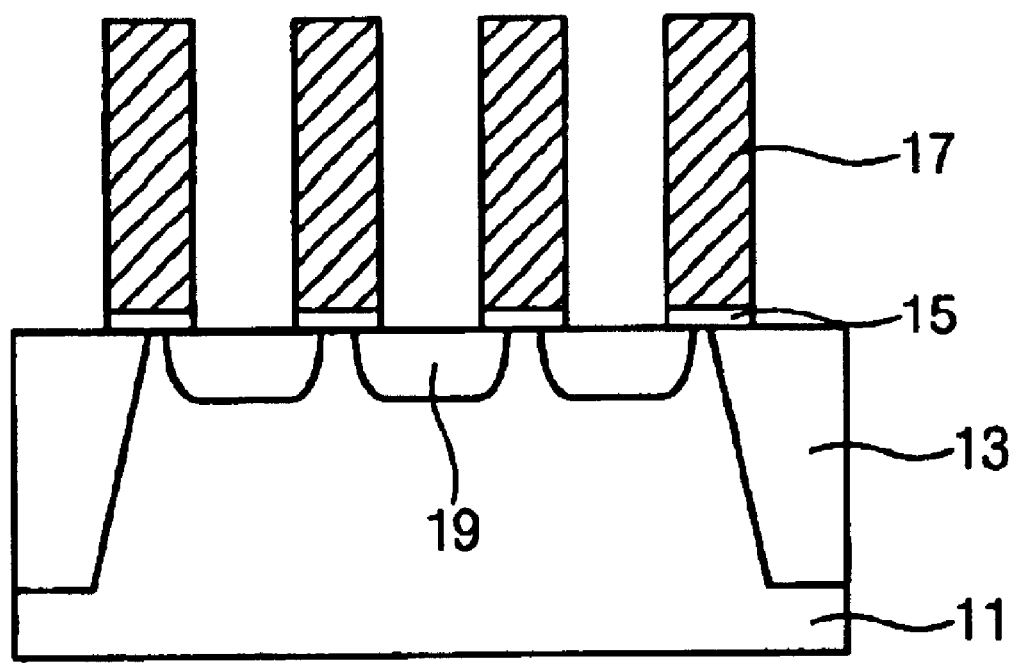
FIG. 2 is a cross-sectional view taken along the line I—I of FIG. 1.
Figure 3A:
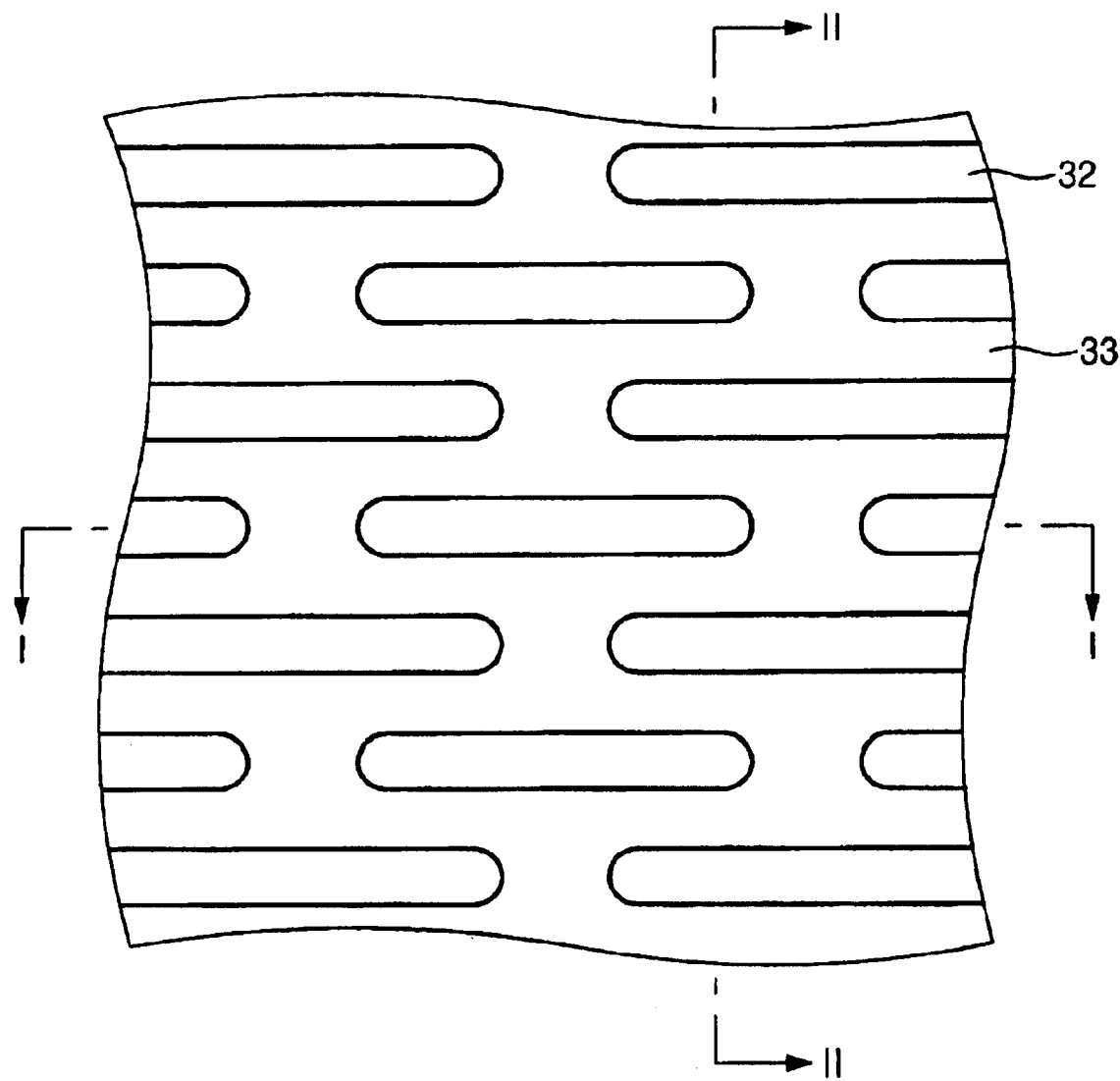
FIGS. 3a through 3d are layout views illustrating a method for forming word line in accordance with one embodiment of the present invention.
Figure 4A:
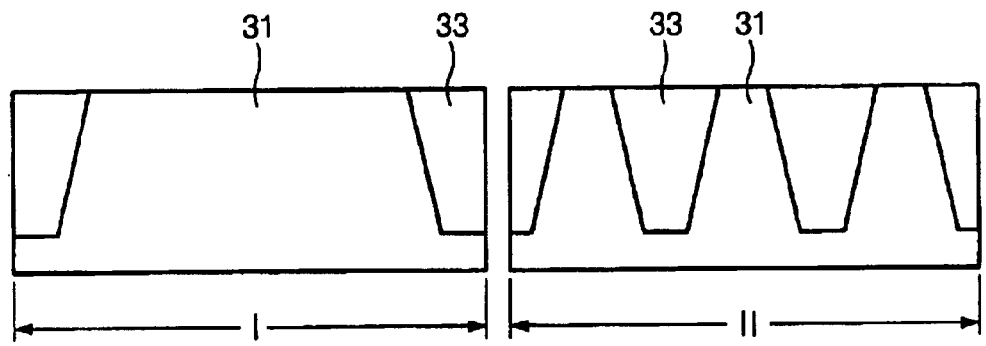
FIGS. 4a through 4d are cross-sectional diagrams taken along the lines I—I and II—II of FIGS. 3a through 3d, respectively.

Referring to FIGS. 3a and 4a, device isolation films 33 defining I-type active regions 32 are formed by performing a shallow trench isolation process in a device isolation region of a p-type semiconductor substrate 31. The active regions 32 are spaced apart by a predetermined distance from one another in horizontal direction, and alternately arranged in vertical direction.

Figure 3B:
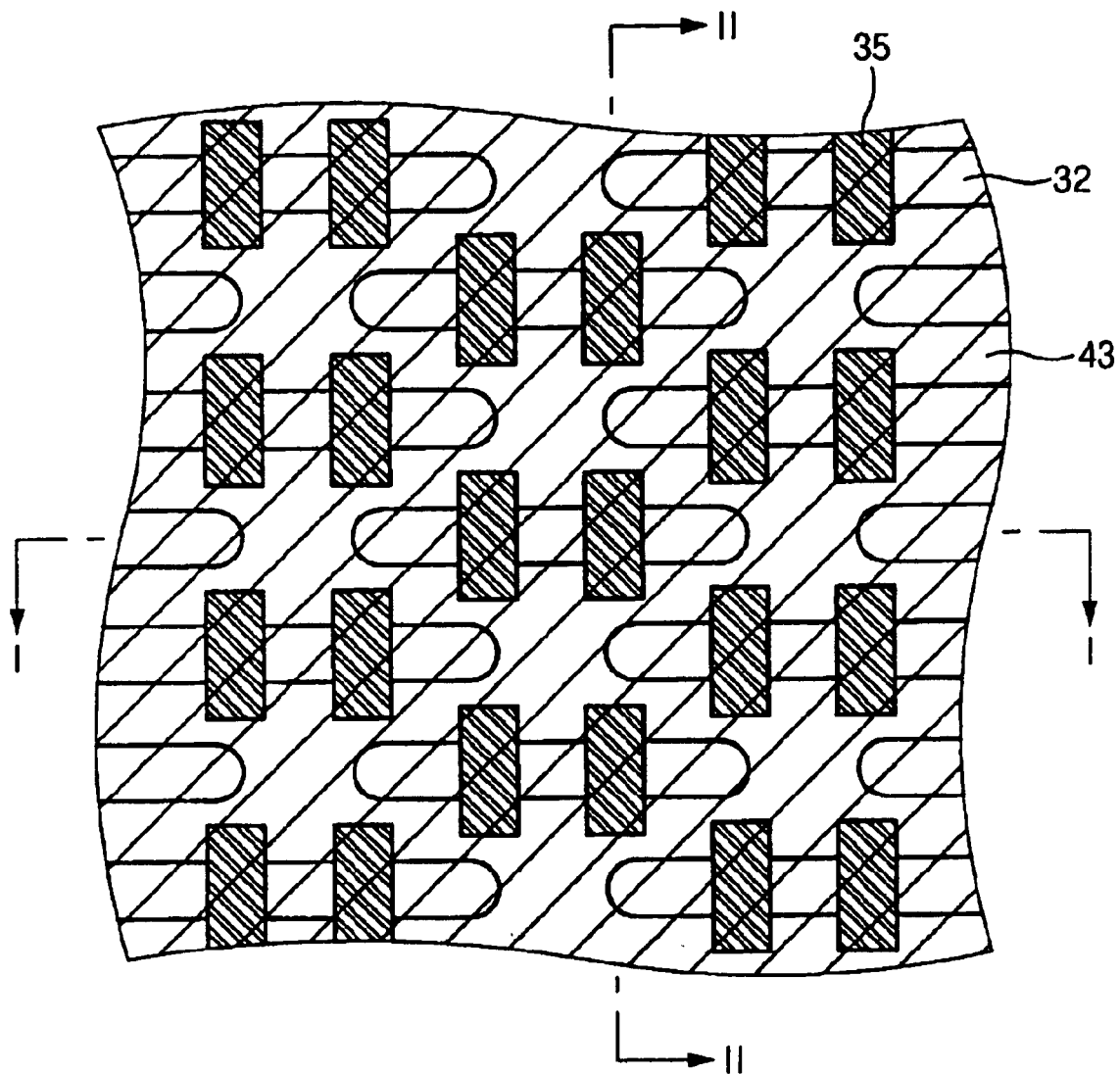
Figure 4B:
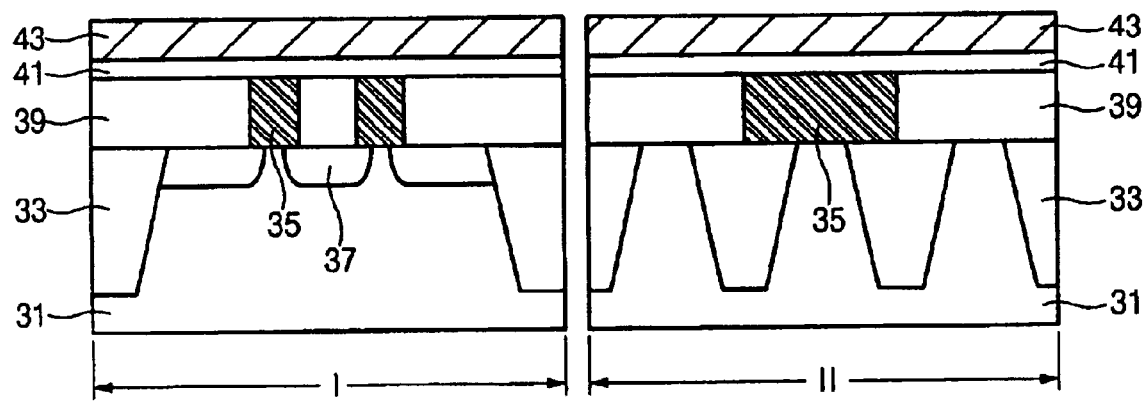

Referring to FIGS. 3b and 4b, a sacrificial insulation film(not shown) which is preferably a nitride film is formed on the semiconductor substrate 31. The sacrificial insulation film is selectively etched to form an I-type sacrificial insulation film pattern 35 on a predetermined region of the active region 32 where a channel region is to be formed.

Thereafter, an n-type impurity ion-implant process is performed on the entire surface using the sacrificial insulation film pattern 35 as a mask, and a drive-in process is then performed to form source/drain regions 37 on the semiconductor substrate 31 at both sides of the sacrificial insulation film pattern 35.

Next, a first interlayer insulation film 39 is formed on the entire surface, and then etched to expose the top surface of the sacrificial insulation film pattern 35. Preferably, the etching process is a dry etch back process, wet etch back process or chemical mechanical polishing.

Thereafter, an insulation film 41 and a second interlayer insulation film 43 are sequentially formed on the entire surface.

Figure 3C:
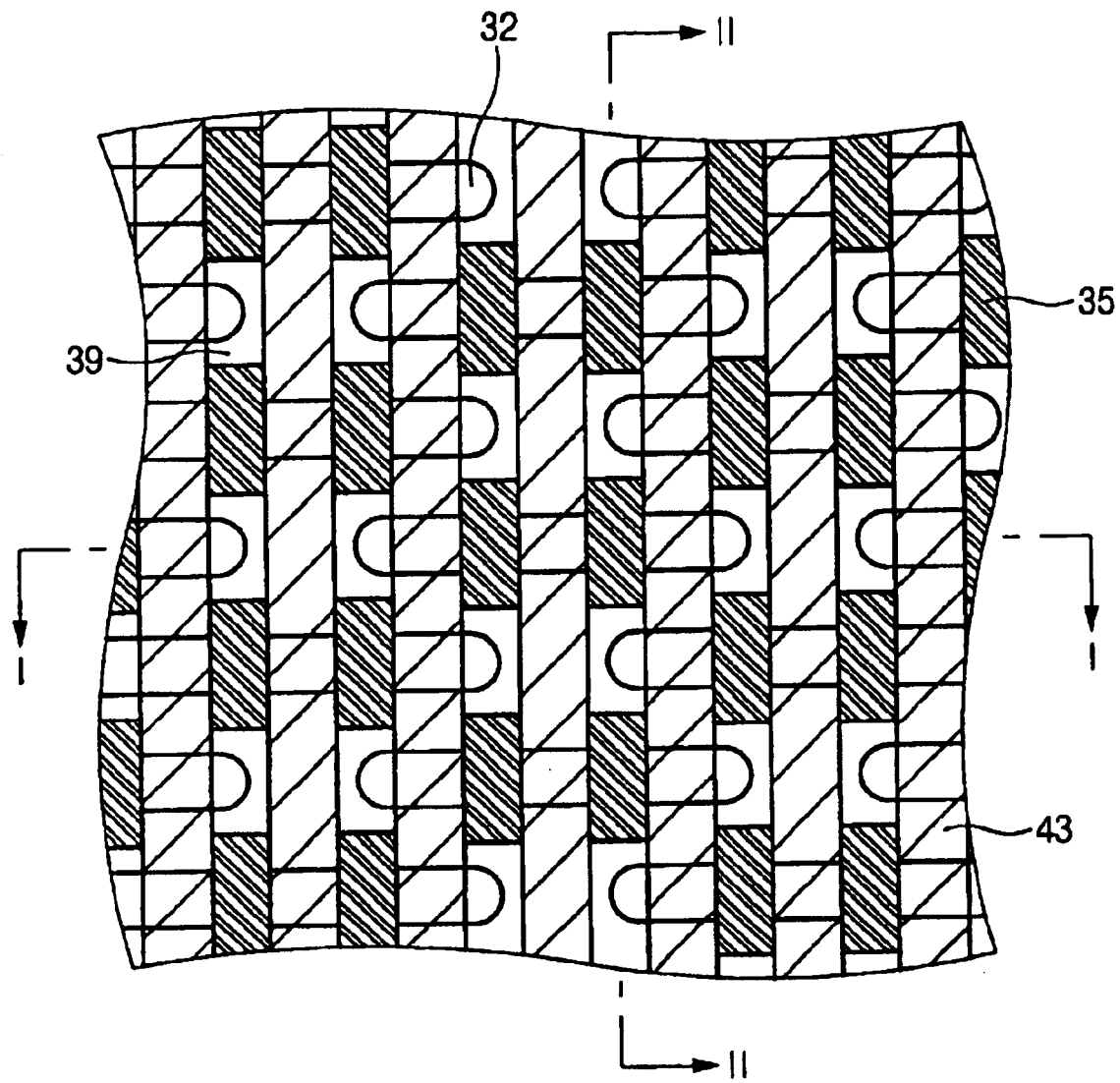
Figure 4C:
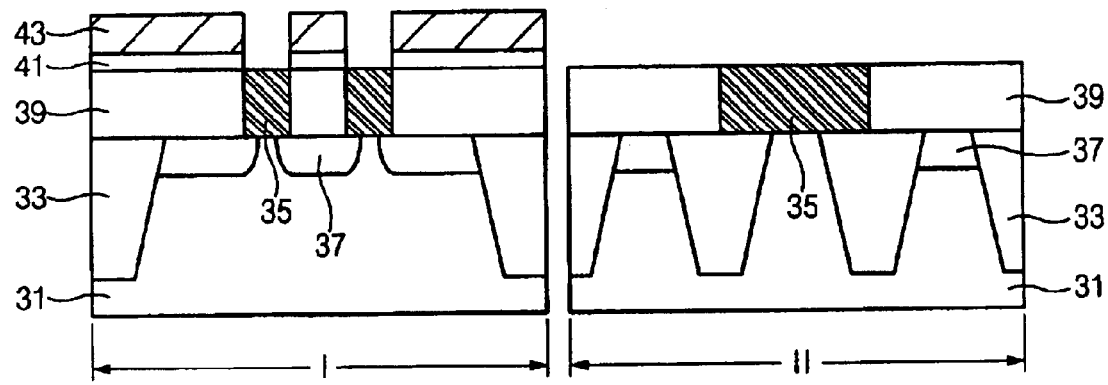

Referring to FIGS. 3c and 4c, a photoresist film is formed on the second interlayer insulation film and then selectively exposed and developed to form a photoresist film pattern exposing a predetermined region where word lines are to be formed. The second interlayer insulation film 43 and the insulation film 41 are etched using the photoresist film pattern as a mask to expose the top surface of the sacrificial insulation film pattern 35. Thereafter, the photoresist film pattern is removed.

Figure 3D:
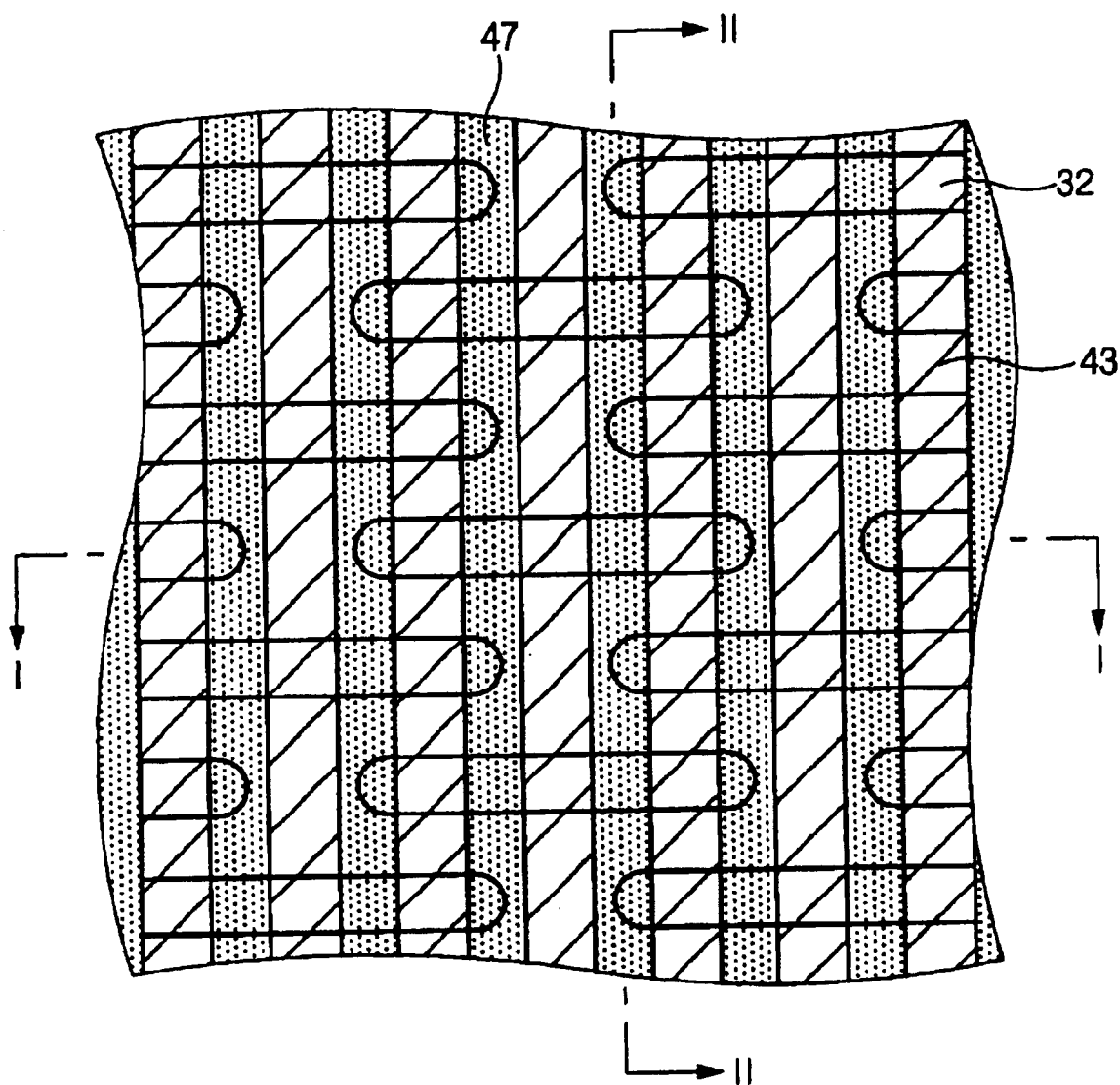
Figure 4D:
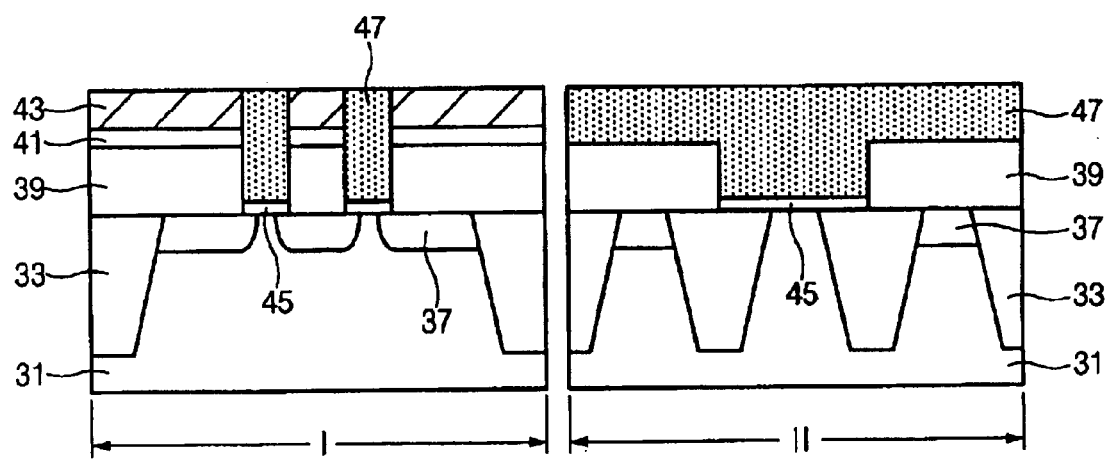

Referring to FIGS. 3d and 4d, the sacrificial insulation film pattern is removed by a dry etching process or a wet etching process to expose the semiconductor substrate 31. A gate oxide film 45 is formed on the exposed portion of the semiconductor substrate by a thermal oxidation process. Thereafter, a conductive layer such as a polysilicon layer is formed on the entire surface and then etched to expose the second interlayer insulation film 43, thereby forming a word line 47. Preferably, the etching process is a dry etch back process, wet etch back process or chemical mechanical polishing.

The word line 47 between the first interlayer insulation film 39 is an I-type word line formed only on the channel region, and the word line 47 between the insulation film 41 and the second interlayer insulation film 43 is an line-type word line.

As described above, in accordance with the method for forming word line of semiconductor device, a lower portion of the word line on the channel region is an I-type and a upper portion of the word line is a line-type, which improves characteristics, yield and reliability of the device.

What is claimed is:

1. A method for forming a word line of a semiconductor device, comprising the steps of:

(a) forming a sacrificial insulation film on a semiconductor substrate including a device isolation film defining an active region;

(b) selectively etching the sacrificial insulation film to form an I-type sacrificial insulation film pattern on a predetermined region of the active region where a channel region is to be formed;

(c) forming a source/drain region on the semiconductor substrate at both sides of the sacrificial insulation film pattern;

(d) forming a first interlayer insulation film on the entire surface;

(e) planarizing the first interlayer insulation film to expose a top surface of the sacrificial insulation film pattern;

(f) sequentially forming a insulation film and a second interlayer insulation film on the entire surface;

(g) etching the second interlayer insulation film and insulation film using a word line mask;

(h) removing the sacrificial insulation film pattern to expose the semiconductor substrate;

(i) growing a gate oxide film on the exposed portion of the semiconductor substrate;

(j) forming a conductive layer on the entire surface; and (k) planarizing the conductive layer to expose the second interlayer insulation film.

2. The method according to claim 1, wherein the step (h) is a dry etch back process, a wet etch back process or a chemical mechanical polishing.

3. The method according to claim 1, wherein the step (e) is a dry etch back process or a wet etch back process.

4. The method according to claim 1, wherein the step (e) is a chemical mechanical polishing.

5. The method according to claim 1, wherein the step (k) is a dry etch back process or a wet etch back process.

6. The method according to claim 1, wherein the step (k) is a chemical mechanical polishing.

* * * * *